(12) United States Patent
Noguchi

(10) Patent No.: US 6,184,098 B1
(45) Date of Patent: Feb. 6, 2001

(54) FIELD EFFECT TRANSISTOR DEVICE AND METHOD OF MANUFACTURING THE SAME

(75) Inventor: Takashi Noguchi, Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/252,862

(22) Filed: Feb. 18, 1999

Related U.S. Application Data

(62) Division of application No. 08/422,319, filed on Apr. 13, 1995, now abandoned.

(30) Foreign Application Priority Data

Apr. 19, 1994 (JP) .............................................. PO6-080684

(51) Int. Cl.[7] .................................................. H01L 21/336
(52) U.S. Cl. ........................ 438/301; 438/607; 438/933; 438/592; 438/301
(58) Field of Search ..................................... 438/607, 933, 438/592, 301

(56) References Cited

U.S. PATENT DOCUMENTS

| 5,126,805 | * | 6/1992 | Bulat et al. | 357/22 |
| 5,172,203 | * | 12/1992 | Hayashi | 257/66 |

* cited by examiner

Primary Examiner—John F. Niebling
Assistant Examiner—Olivia Luk
(74) Attorney, Agent, or Firm—Ronald F. Kananen; Rader, Fishman & Grauer

(57) ABSTRACT

In a field effect transistor, an $Si_{1-x}Ge_x$ layer is provided between a source or drain electrode deriving region and a corresponding metal (interconnection) electrode or between a contact deriving region and a metal layer formed on the upper portions of the contact deriving region to form an ohmic contact to thereby prevent the aluminum metal layer from penetrating into a p-n junction and to reduce a contact resistance.

20 Claims, 3 Drawing Sheets

FIELD EFFECT TRANSISTOR DEVICE AND METHOD OF MANUFACTURING THE SAME

This application is a divisional of application Ser. No. 08/422,319 filed Apr. 13, 1995 now abandoned.

BACKGROUND OF THE INVENTION

1. Field of the Invention

The present invention relates to an insulating gate type field effect transistor (hereinafter referred to as "MOS transistor" but the gate insulating layer thereof is not limited to an oxide layer) and a method of manufacturing the same. More particularly, this invention relates to a MOS transistor of a silicon semiconductor having a silicon gate electrode layer and a method of manufacturing the same.

2. Description of the Related Art

As a metal electrode or a metal interconnection (referred to as "metal electrode" in this specification) in a semiconductor integrated circuit or a single semiconductor element, a metal electrode made of aluminum (Al) has been widely used from a standpoint of workability, electrical conductivity, etc. of the aluminum.

FIG. 1 of the accompanying drawings shows, in cross-sectional form, an example of a conventional MOS transistor of silicon (Si) semiconductor, such as an MOS transistor of a lightly-doped drain type (LDD type) Si semiconductor in which the gate side in the drain thereof is lightly doped. In such an MOS transistor of LDD type Si semiconductor, as shown in FIG. 1, a gate electrode layer 3 made of polycrystalline silicon is formed on a silicon semiconductor portion 1 formed of a silicon semiconductor layer or a silicon semiconductor substrate, for example, through a gate insulating layer 2 made of $SiO_2$. Then, lightly-doped source and drain portions $4S_1$ and $4D_1$ are formed by implanting ions or the like, by employing the gate electrode layer 3 and the gate insulating layer 2 as a mask. Thereafter, a side wall 5 of $SiO_2$ is formed on the side surfaces of the gate electrode layer 3 and the gate insulating layer 2 at their lightly-doped source and drain portion $4S_1$ and $4D_1$ sides. Heavily-doped source and drain portions $4S_2$ and $4D_2$ are formed, for example, by implanting ions by using the side wall 5, the gate electrode layer 3 and the gate insulating layer 2 as a mask, thereby a source 4S and a drain 4D being formed, respectively.

Reference numeral 6 depicts an isolating and insulating layer formed on the surface of the silicon semiconductor portion 1 by local oxidation of silicon (LOCOS).

In the aforementioned structure, the upper surface of the resulting structure is covered with an insulating layer 8 of $SiO_2$. Through electrode windows bored through the insulating layer 8, a source metal electrode 7S, a drain metal electrode 7D and a gate electrode 7G are formed so as to be ohmically connected to the source 4S, the drain 4D and the gate electrode layer 3 of polycrystalline Si, respectively.

When an aluminum layer is used to form the source, drain and gate electrodes 7S, 7D and 7G, there is the problem that the aluminum penetrates into the p-n junctions in the source and drain.

Particularly, since the depth $x_j$ of each of the junctions decreases with the recent advance of scale-reduction of MOS transistor, the aluminum tends to much more penetrate into the junctions. A metal electrode made of aluminum generally employs a multilayer structure in which the Al electrode layer is formed on a separating layer 11, for example, formed by a Ti layer 9 and a TiON layer 10, for separating the aluminum from the silicon.

In the case that such a separating layer is provided, however, the resistance of the contact portions of the electrodes is increased if the thickness of the separating layer is increased so as to positively avoid the penetration of the aluminum.

SUMMARY OF THE INVENTION

In view of the aforesaid aspect, it is an object of the present invention to provide a contact electrode or an insulating gate type field effect transistor and a method of manufacturing the same in which aluminum is prevented from penetrating into a p-n junction when the metal layer containing the aluminum is used as the electrodes for a transistor.

It is another object of the present invention to provide a contact electrode or an insulating gate type field effect transistor and a method of manufacturing the same in which contact resistance and sheet resistance at contact portions of a metal electrode that is used as an electrode or a contact for a transistor are decreased.

According to an aspect of the present invention, in order to achieve the above objects, a contact electrode is comprised of a semiconductor substrate, a diffusion region formed in the semiconductor substrate and having an impurity density larger than that of the semiconductor substrate, an $Si_{1-x}Ge_x$ layer formed on the diffusion region where x is an arbitrary value between 0 and 1, and a deriving metal layer formed on the $Si_{1-x}Ge_x$ layer for deriving an electrode.

Preferably, a high melting-point metal layer or a high melting-point metallocompound layer is formed between the $Si_{1-x}Ge_x$ layer and the electrode deriving metal layer.

Preferably, the electrode deriving metal layer is formed of aluminum.

Preferably, the electrode deriving metal layer is formed of aluminum containing Si or Cu.

Preferably, the high melting-point metal layer or the high-melting point metallocompound layer is made of one material selected from the group consisting of Ti, TiN and TiON.

According to another aspect of the present invention, in an insulating gate type field effect transistor having metal electrodes ohmically connected to source and drain portions composed at least of a silicon semiconductor, the metal electrodes are ohmically connected to the source and drain portions through an $Si_{1-x}Ge_x$ layer, respectively.

Preferably, the metal electrode contains at least aluminum.

Preferably, a gate electrode is constituted by a polysilicon layer or a polysilicon layer containing a high melting-point metal, an $Si_{1-x}Ge_x$ layer, and an Al metal layer.

Preferably, a gate electrode is constituted by a polysilicon layer, an $Si_{1-x}Ge_x$ layer, a Ti-TiON layer or a Ti-TiN layer, and an Al layer containing Si.

According to a further aspect of the present invention, in a method of manufacturing an insulating gate type field effect transistor in which a metal electrode is ohmically connected to source and drain portions composed of at least a silicon semiconductor, the method is comprised of the steps of coating an oxide insulating layer having formed with openings at portions on the source and drain portions where the metal electrodes are to be ohmically connected epitaxially growing an $Si_{1-x}Ge_x$ layer selectively on at least the source and drain portions exposed to the outside through the openings of the oxide insulating layer by vapor growth epitaxy process, respectively, and depositing a metal electrode on the $Si_{1-x}Ge_x$ layer in an ohmic contact fashion.

Preferably, the metal electrode is a metal which contains at least aluminum.

According to the present invention, an $Si_{1-x}Ge_x$ layer is formed before an electrode for a silicon semiconductor is formed and then the electrode is formed on the $Si_{1-x}Ge_x$ layer. Accordingly, even in the case that the metal electrode is formed of aluminum, the aluminum is prevented from penetrating into junctions in the source and drain portions due to the presence of the $Si_{1-x}Ge_x$ layer.

In the manufacturing method according to the present invention, the $Si_{1-x}Ge_x$ layer is epitaxially grown selectively on the silicon layer by vapor growth epitaxy so that the $Si_{1-x}Ge_x$ layer can be securely formed through an opening of the oxide insulating layer only in a portion where the electrode is to be formed. Furthermore, the $Si_{1-x}Ge_x$ layer thus formed is of low resistance. Accordingly, since the metal electrode can be led out with low resistance, series resistance of the MOS transistor can be reduced, the aluminum can be prevented from penetrating into the junctions, and increase of resistance can be avoided when the depth of the junctions is shallow, whereby reliability of the transistors can be improved.

DETAILED DESCRIPTION OF THE PREFERRED EMBODIMENT

A contact electrode, an insulating gate type field effect transistor and a method of manufacturing the same according to an embodiment of the present invention will be described below with reference to FIGS. 2A to 2E, in which case, the present invention is applied to an LDD type MOS transistor.

Figure 1:
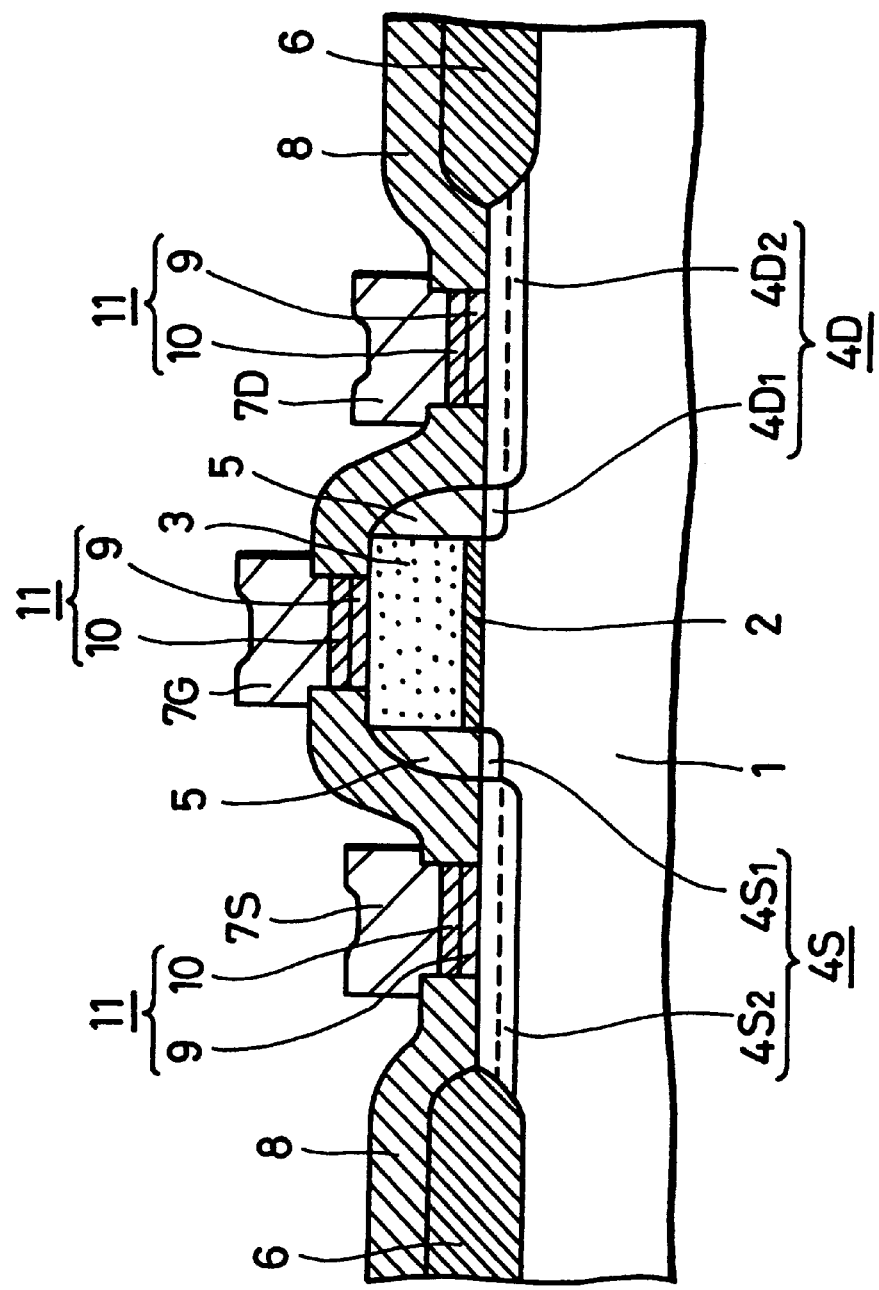
FIG. 1 is a cross-sectional view of a main portion of an insulating gate type field effect transistor according to the related art.
Figure 2A:
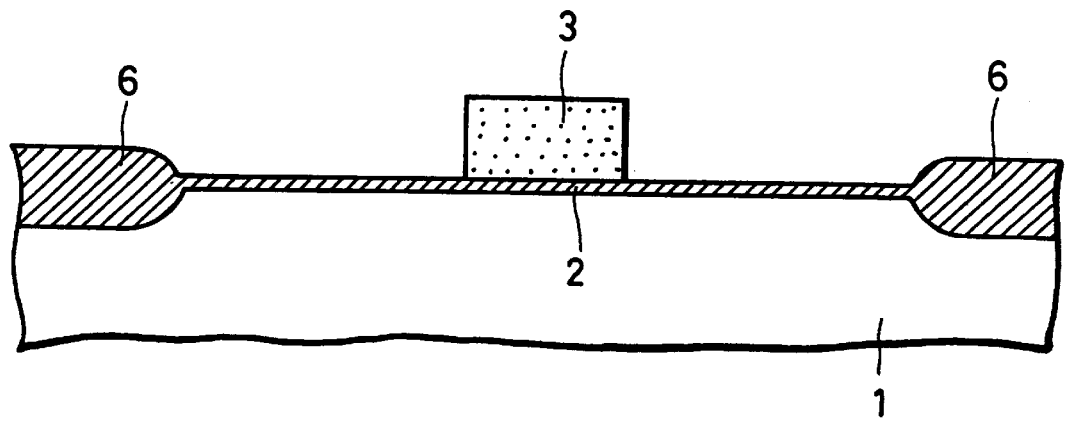
FIGS. 2A to 2E are cross-sectional views showing an insulating gate type field effect transistor according to an embodiment of the present invention and to which reference will be made in explaining processes of a method of manufacturing the same, respectively.

As shown in FIG. 2A, a semiconductor portion 1 is formed of a first conductivity type (e.g., n-type or p-type) lightly-doped silicon semiconductor layer or substrate.

An isolating and insulating layer 6 of $SiO_2$ or the like is formed on the semiconductor portion 1 by LOCUS, for example, by using a resist mask formed at the surface of the semiconductor portion 1 except for portions where elements are to be formed.

Then, after the surface of the LOCUS and the surfaces of the portions where elements are to be formed are etched away, a thin oxide film 2, for example, of $SiO_2$ is newly formed on the etched away portion with high quality. This film 2 is used as a gate oxide film for an MOSFET.

A polycrystalline polysilicon layer is epitaxially grown on the gate oxide film 2 by chemical vapor deposition (CVD) or the like and patterned to thereby form a gate electrode 3.

Figure 2B:
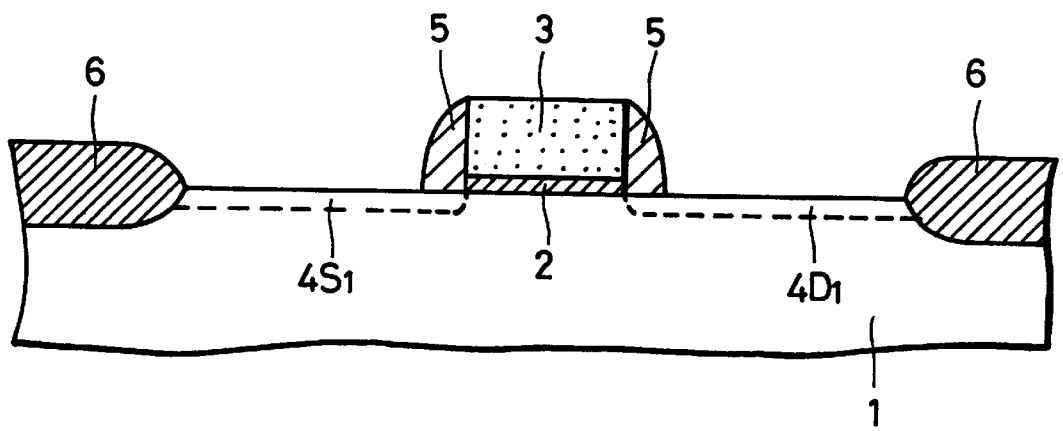

Then, as shown in FIG. 2B, second conductivity type (e.g., p-type or n-type) low-density source and drain regions $4S_1$ and $4D_1$ are formed by ion implantation by using the gate electrode layer 3 as a mask.

Then, an insulating film, for example, of $SiO_2$ is epitaxially grown on the LOCUS 6, the gate insulating oxide film 2 and the gate electrode layer 3 by CVD. Thereafter, the insulating film is etched away by RIE (reaction ion etching) to the extent that an upper surface of the gate electrode 3 and surfaces of the source and drain regions are exposed. As a result, a side wall 5 is formed on the sides of the gate electrode layer 3.

Figure 2C:
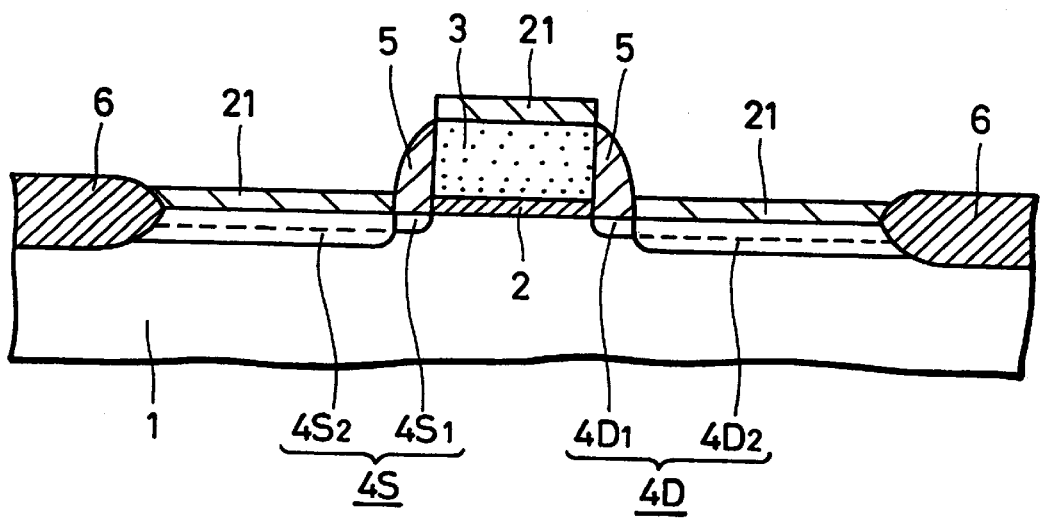

Referring to FIG. 2C, heavily-doped source and drain regions $4S_2$ and $4D_2$ of the same conductivity type as that of the lightly-doped source and drain regions $4S_1$ and $4D_1$, i.e., the second conductivity type are formed, for example, by ion implantation by using the side wall 5, the gate electrode layer 3 and the gate insulating layer 2 as a mask. Thus, a source 4S and a drain 4D are formed that have the lightly-doped source and drain regions $4S_1$ and $4D_1$ on the gate portion sides, respectively, and have p-n junctions, respectively, formed relative to the semiconductor portion 1.

In particular, according to the present invention, an $Si_{1-x}Ge_x$ layer is selectively and epitaxially grown at low temperature by vapor growth epitaxy. By such expitaxial growth, an $Si_{1-x}Ge_x$ layer 21 can be formed selectively only on the silicon exposed to the outside. By way of example, this selective low-temperature vapor growth epitaxy of $Si_{1-x}Ge_x$ is carried out by supplying raw-material gas such as $SiH_4$ and $GeH_4$ to the silicon surface at a growth temperature of 550° C. This growth process may be performed by employing a well-known method described in Extended Abstracts of the 1993 International Conference on Solid State Devices and Materials, Makuhari, 1993, pp. 380–382, for example.

The $Si_{1-x}Ge_x$ layer may be selected so that the thickness thereof falls in a range of about 50 to 3000Å and that the value of x is an arbitrary value between 0 and 1, preferably, in a range of about $0.01 \leq x \leq 0.85$.

It is preferable that, before the deposition of the $Si_{1-x}Ge_x$ layer 21, an oxide film formed by natural oxidation on the silicon surface, where the $Si_{1-x}Ge_x$ is to be deposited selectively, is removed, for example, by heat treatment in an atmosphere Of $H_2$ at 750° C. Alternatively, $H_2$ may be contained in the gas supplied for the CVD process of the $Si_{1-x}Ge_x$ layer 21 or $H_2$ may be supplied before the CVD process of the $Si_{1-x}Ge_x$ layer 21.

Further, in the selective CVD process of the $Si_{1-x}Ge_x$ layer 21, impurity gas forming the same conductivity type as that of the source and drain 4S and 4D may be mixed in the raw-material gas thereof. That is, for example, $B_2H_6$ or the like may be mixed in the raw-material gas when the conductivity type of the source and drain 4S and 4D is the n-type, or $ASH_3$ or the like may be mixed in the raw-material gas when the conductivity type of the source and drain 4S and 4D is the p-type. As a result, the $Si_{1-x}Ge_x$ layer 21 may be formed as an $Si_{1-x}Ge_x$ layer in which boron B or arsenic As is doped. When an integrated circuit device including two conductivity type transistors, i.e., n-type and p-type transistors such as a complementary MOS (C-MOS) structure is to be formed on the same substrate, however, the $Si_{1-x}Ge_x$ layer 21 containing no impurity is formed by selective CVD) and then the $Si_{1-x}Ge_x$ layer 21 is doped with a predetermined conductivity type impurity such as B and As by ion implantation or the like.

Figure 2D:
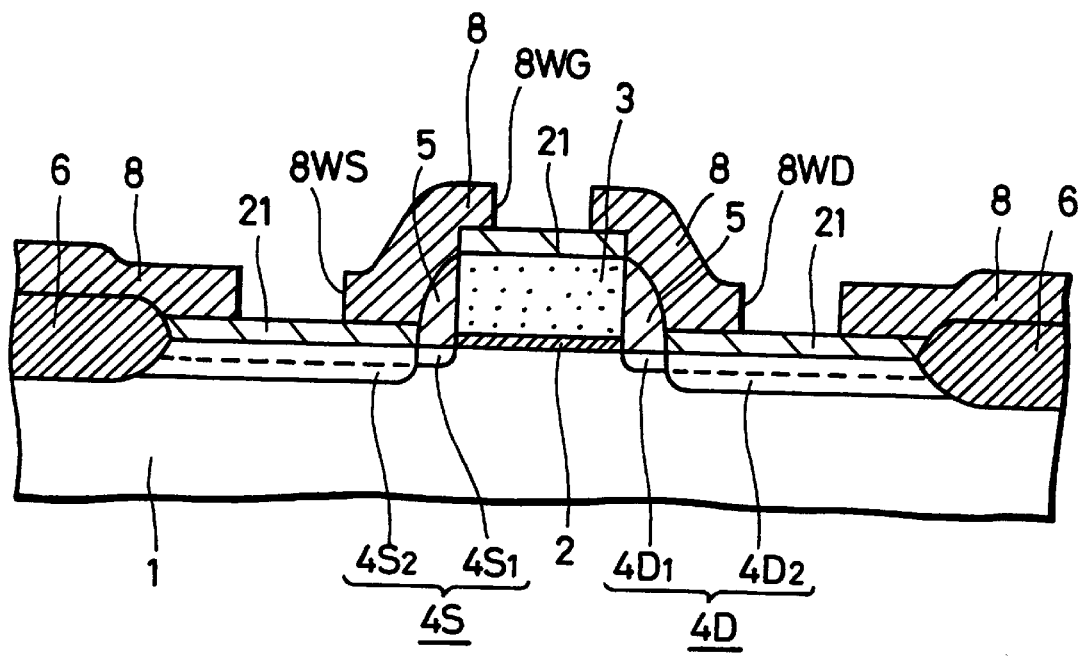

Thereafter, as shown in FIG. 2D, an insulating layer 8 Of $SiO_2$, for example, is formed on the whole surface of the resulting structure by CVD. Then, electrode windows 8WG, 8WS and 8WD are photolithographically formed through portions of the insulating layer where metal electrodes are to be formed on the gate electrode layer 3 of Si and on the source and drain regions 4S and 4D, respectively.

Figure 2E:
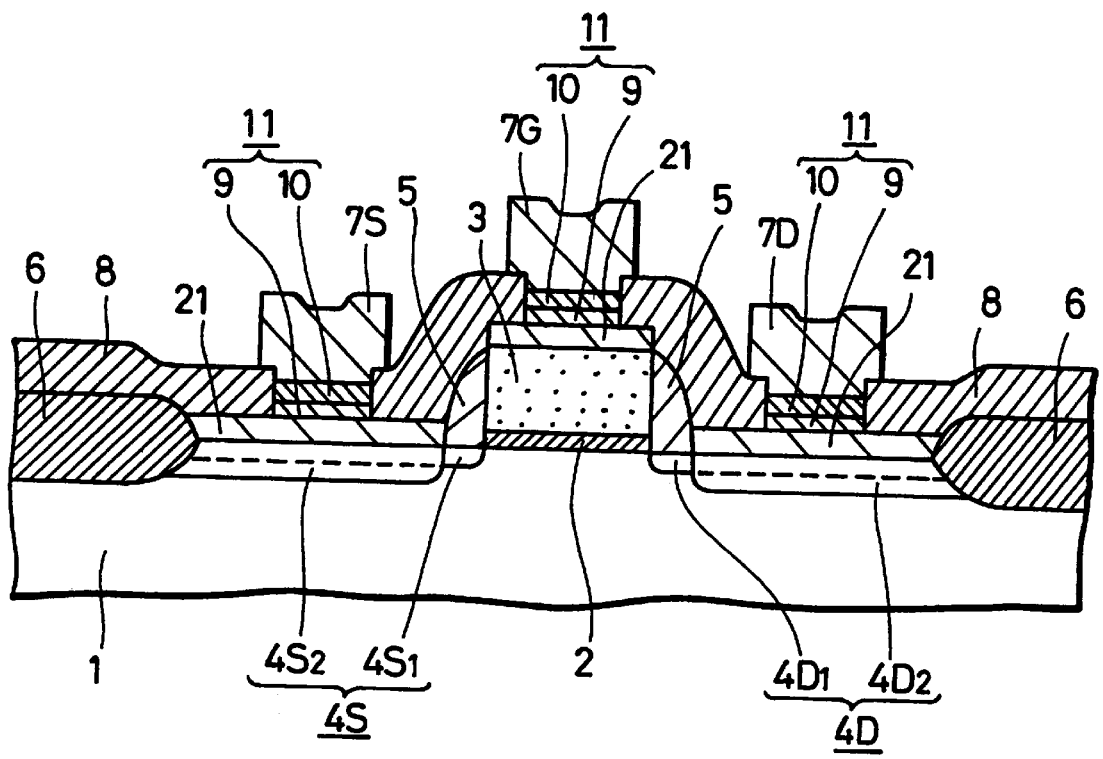

Then, as shown in FIG. 2E, gate, source and drain metal electrodes 7G, 7S and 7D are formed by deposition of, for example, aluminum containing Si in a range of 1% to 2% or aluminum containing Cu of 1% through the electrode windows 8WG, 8WS and 8WD, respectively. These gate, source and drain metal electrodes 7G, 7S and 7D can be formed simultaneously in a manner that the aluminum layer is formed on the whole surface inclusive of the electrode windows 8WG, 8WS and 8WD by sputtering or the like and then the aluminum layer is patterned by photolithography.

In this case, the metal electrodes 7G, 7S and 7D each formed of aluminum may be deposited directly on the $Si_{1-x}Ge_x$ layer 21. Alternatively, however, in order to prevent the aforementioned penetration of Al more reliably, as shown in FIG. 2E, a separating layer 11 may be formed on the $Si_{1-x}Ge_x$ layer 21 by sequentially forming a Ti layer 9 and a TiON layer (or TiN layer) 10 on the layer 9 by sputtering or the like. Then, the aforementioned metal electrodes 7G, 7S and 7D of Al can be formed on the separating layers 11, respectively.

As described above, according to the present invention, since the MOS transistor is arranged so that the metal electrodes containing aluminum is formed on the target silicon through the $Si_{1-x}Ge_x$ layer 21, the $Si_{1-x}Ge_x$ layer 21 can prevent the aluminum from penetrating into the silicon, i.e., the p-n junctions in the source and drain.

Further, the sheet resistivity of the $Si_{1-x}Ge_x$ layer 21 in this case exhibits a low value of about 50 $\Omega/\square$ when the impurity density, thickness and Ge content x thereof are $10^{20}$ atoms/$cm^3$, 100 nm and 0.85, respectively, whereby resistance in each of electrode deriving portions can be reduced.

While the present invention is applied to the LDD type MOS transistors as described above, the present invention is not limited thereto. Further, the present invention may be applied to various structures, such as MOS transistors in integrated circuits including C-MOS transistors of different conductivity types.

While the metal electrodes are formed so as to ohmically contact with the source and the drain that have been formed in advance as described above, the present invention is not limited thereto. That is, impurities may be diffused into the semiconductor portion 1 through the $Si_{1-x}Ge_x$ layer doped with impurities to thereby form the source and the drain, so that the contact portions and the source and drain can be self-aligned.

According to the present invention, the $Si_{1-x}Ge_x$ layer is formed before the electrodes for the silicon semiconductor are formed, and then the metal electrodes are formed on the $Si_{1-x}Ge_x$ layer. Accordingly, even when each of the metal electrodes is formed of aluminum, the aluminum can reliably be prevented from penetrating into the junctions in the source and drain due to the presence of the $Si_{1-x}Ge_x$ layer.

Accordingly, a desired transistor with high reliability can be formed.

Further, since the penetration of the aluminum can reliably be avoided as described above, the source and drain can be formed as more shallow junctions. Accordingly, the scale of the transistor can be further reduced, and integrated circuits can be made higher in density.

According to the manufacturing method of the present invention, since the $S_{1-x}Ge_x$ layer is formed by selective vapor growth onto the silicon, the $S_{1-x}Ge_x$ layer can reliably be formed only in portions where the electrodes are to be formed that are exposed through openings of the oxide insulating layer. Furthermore, since the $S_{1-x}Ge_x$ layer thus formed is of low resistance, metal electrodes can be derived with low resistance, so that series resistance of the MOS transistor can be reduced.

While the present invention is applied to the MOSFET by way of example, it is apparent from FIGS. 2A through 2E that the present invention can also be applied to the deriving of various semiconductor electrodes. That is, the present invention may be applied, for example, to IC processes in which an aluminum layer is used generally as interconnection layers or to the deriving of both electrodes of a diffusion resistor. Further, the present invention may be applied to leading-out of an electrode from a semiconductor layer equivalent to one electrode plate of an MIS capacitor or to the deriving of emitter and collector electrodes from a bipolar transistor and so on.

Having described a preferred embodiment of the present invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A method of manufacturing an insulating gate type field effect transistor in which metal electrodes are ohmically connected to a gate electrode and to source and drain portions of a silicon semiconductor substrate, said method comprising:

forming an insulating layer on said substrate having openings therein through which said source and drain portions are formed;

forming said gate electrode and said source and drain portions;

epitaxially growing an $Si_{1-x}Ge_x$ layer selectively only on said gate electrode and on said source and drain portions exposed through said openings of said insulating layer, said growing an $Si_{1-x}Ge_x$ layer being performed by vapor growth epitaxy; and depositing metal electrodes on said $Si_{1-x}Ge_x$ layer.

2. The method of claim 1, wherein said depositing metal electrodes comprises forming said metal electrodes from a material which contains aluminum.

3. The method of claim 1, wherein said forming an insulating layer further comprising depositing said insulating layer on said substrate and etching said insulating layer to form an element opening in which said gate electrode and said source and drain portions will be formed.

4. The method of claim 3, wherein said forming said gate electrode further comprising forming said gate electrode by epitaxially growing a polycrystalline layer in said element opening by chemical vapor deposition.

5. The method of claim 1, wherein said forming said source and drain portions comprising using said insulating layer and said gate electrode as a mask during a first phase of impurity implantation to form said source and drain portions.

6. The method of claim 5, further comprising forming a sidewall of insulating material around sides of said gate electrode subsequent to said first phase of impurity implantation.

7. The method of claim 6, wherein said forming source and drain portions further comprises a second phase of impurity implantation subsequent to said forming said sidewall such that said gate electrode, said insulating layer and said sidewall serve as a mask during said second phase of impurity implantation.

8. The method of claim 1, wherein said forming source and drain portions further comprises forming a first and second source portions and a first and second drain portions, wherein said first source portion and said first drain portion are more heavily doped with an impurity than said second source portion and said second drain portion.

9. The method of claim 8, wherein said second source portion and said second drain portion are adjacent to said gate electrode, while said first source and drain portions are spaced from said gate electrode by said second source and drain portions, respectively.

10. The method of claim 1, further comprising removing a native oxide film from said gate electrode and said exposed source and drain portions before said epitaxially growing said $Si_{1-x}Ge_x$ layer.

11. The method of claim 1, wherein said growing said $Si_{1-x}Ge_x$ layer further comprises controlling a thickness of said $Si_{1-x}Ge_x$ layer to be between 50 and 3000 Angstroms.

12. The method of claim 1, wherein said growing said $Si_{1-x}Ge_x$ layer further comprises controlling x to be between 0 and 1.

13. The method of claim 12, wherein said growing said $Si_{1-x}Ge_x$ layer further comprises controlling x to be between 0.01 and 0.85.

14. The method of claim 1, wherein said growing said $Si_{1-x}Ge_x$ layer further comprises mixing an impurity gas with source gases used to form said $Si_{1-x}Ge_x$ layer.

15. The method of claim 14, wherein said impurity gas is either $B_2H_6$ or $AsH_3$.

16. The method of claim 1, wherein said growing said $Si_{1-x}Ge_x$ layer further comprises implanting impurity ions in said $Si_{1-x}Ge_x$ layer.

17. The method of claim 1, further comprising forming a second insulating layer after said growing an $Si_{1-x}Ge_x$ layer, wherein said second insulating layer is formed so as to partially cover said $Si_{1-x}Ge_x$ layer on each of said gate electrode and said source and drain portions, but having electrode openings communicating through said second insulating layer with said $Si_{1-x}Ge_x$ layer on each of said gate electrode and said source and drain portions.

18. The method of claim 17, further comprising depositing, sequentially, a Ti layer and a TiON in said electrode openings.

19. The method of claim 18, wherein said depositing metal electrodes if performed subsequent to said depositing said Ti layer and said TiON layer, said metal electrodes being formed in said electrode openings.

20. The method of claim 17, wherein said depositing metal electrodes comprises forming said metal electrodes in said electrode openings.

* * * * *